(12) United States Patent
Kopf

(10) Patent No.: US 6,480,395 B1
(45) Date of Patent: Nov. 12, 2002

(54) DEVICE AND METHOD FOR INTERSTITIAL COMPONENTS IN A PRINTED CIRCUIT BOARD

(75) Inventor: Dale R. Kopf, Middleton, ID (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/579,022

(22) Filed: May 25, 2000

(51) Int. Cl.[7] ................................................ H05K 7/02
(52) U.S. Cl. .................... 361/760; 361/761; 361/766; 361/736; 361/720; 428/901
(58) Field of Search ................................ 361/760, 761, 361/764, 776, 790, 795, 807, 750, 736, 720, 719, 721; 428/901

(56) References Cited

U.S. PATENT DOCUMENTS

| | | | | |
|---|---|---|---|---|
| 4,544,989 A | * | 10/1985 | Nakabu et al. | 361/401 |
| 4,964,737 A | * | 10/1990 | Baker et al. | 374/179 |
| 5,166,773 A | | 11/1992 | Temple et al. | 257/678 |
| 5,237,204 A | * | 8/1993 | Val | 257/698 |
| 5,280,192 A | * | 1/1994 | Kryzaniwsky | 257/723 |
| 5,426,263 A | | 6/1995 | Potter e tal. | 174/52.4 |
| 6,242,282 B1 | * | 6/2001 | Fillion et al. | 438/106 |

FOREIGN PATENT DOCUMENTS

JP   1004098   1/1989   ............ H05K/5/00

* cited by examiner

Primary Examiner—David Martin
Assistant Examiner—Hung Bui

(57) ABSTRACT

A printed circuit board (PCB) includes a first layer having first and second surfaces, with an above-board device mounted thereon. The PCB includes a second layer having third and fourth surfaces. One of the surfaces can include a recessed portion for securedly holding an interstitial component. A via, electrically connecting the PCB layers, is also coupled to a lead of the interstitial component.

6 Claims, 2 Drawing Sheets

DEVICE AND METHOD FOR INTERSTITIAL COMPONENTS IN A PRINTED CIRCUIT BOARD

BACKGROUND OF THE INVENTION

1. Field of the Invention

The present invention is directed to a printed circuit board having an interstitial component and a method of making the same.

2. Description of the Related Art

Conventional printed circuit boards ("PCBs") require more space as components are added. Such components include integrated circuits ("ICs"), application specific integrated circuit ("ASIC") chips, diodes, transistors, resistors, capacitors, thermocouples, and the like. In addition, the lack of space on the surface of the PCB can prevent the optimal placement of electrical components, such as sensing components, with respect to the chip or IC being monitored.

For example, thermocouples can be employed in two conventional ways to monitor an ASIC on a PCB. The first implementation is to glue a thermocouple onto the top of the ASIC with long wires soldered to the board. A second conventional implementation is to solder a small thermocouple (either a monolithic part or a discrete part) to the PCB some distance from the ASIC.

The first implementation requires significant (and expensive) post-processing by hand after the PCB has been loaded by a machine. The soldering and the gluing must be done by a technician. This implementation results in accurate temperature sensing because the thermocouple makes direct contact with the ASIC.

The second implementation results in the thermocouple being placed some distance from the device it is trying to measure. This approach is most commonly employed, since the parts can be placed by machine and thus minimize the associated costs. However, a problem with this second approach is that it leads to inaccurate results, due to potential air movement between the device and the thermocouple.

A current method for connecting coupling and terminating components is to run traces on internal layers of the PCB and then use a via or multiple vias to bring the signal to the surface. The signal goes through the appropriate component and then through another via back down to an inner signal layer. However, there are several problems with this conventional implementation.

The first, and most important problem, is that the vias and the above-board components cause perturbations in the impedance of the trace. Such perturbations cause voltage and current reflections in the trace due to the impedance mismatch. Secondly, when high-speed signals reach the outer layers of the PCB, the electromagnetic energy that is radiated can no longer be contained by the board itself. This electromagnetic energy can cause electromagnetic interference (EMI) problems and may increase the engineering time required to solve electromagnetic compatibility (EMC) problems associated with the EMI.

SUMMARY OF THE INVENTION

In view of the foregoing, according to an embodiment of the present invention, a printed circuit board (PCB) comprises a first layer having first and second surfaces, with a device mounted on the first surface. The PCB also includes a second layer having third and fourth surfaces, with the fourth surface being the bottom of the PCB. One of the second and third surfaces can include a recessed portion for securedly holding an interstitial component. A via, electrically connecting the PCB layers, is coupled to a lead of the interstitial component.

According to yet another embodiment of the present invention, a method of making a printed circuit board having an interstitial component, and also including a first substrate layer having first and second surfaces and a second layer having third and fourth surfaces, comprises routing a portion of one of the second and third surfaces a layer surface to form a recessed portion. An interstitial component is placed in the recessed portion and a solder paste compound is applied to a surface-mount axial lead of the interstitial component to couple the lead from the interstitial component to an inner trace of the printed circuit board.

With the apparatus and methods according to several of the embodiments of the present invention, distinct advantages over conventional devices can be achieved. For example, in conventional structures the placement of devices, especially passive devices, was implemented by placing them on either side of a PCB. With the PCB according to the present invention, such components can be placed inside the PCB. There are several advantages to this type of PCB construction. First, the PCB according to several of the embodiments of the present invention eliminates components from the top and bottom of the PCB, thus freeing space for larger components such as ASICs. Further, the PCB design allows interstitial components to be placed in optimal position in relation to above-board components that are being monitored or are sending signals. For example, the PCB design according to the present invention allows certain components to be optimally placed in relation to high speed signal traces such that signal perturbations and potential EMI radiation are significantly reduced. Other advantages include the possibility of tuning the PCB substrate cavity to further enhance signal quality and reducing the number of signal vias that must traverse the PCB.

Further features of the invention form the subject matter of the claims and will be explained in more detail, in conjunction with further advantages of the invention, with reference to exemplary embodiments.

BRIEF DESCRIPTION OF THE DRAWINGS

The accompanying drawings, which are incorporated herein and form part of the specification, illustrate an embodiment of the present invention and, together with the description, further serve to explain the principles of the invention and to enable a person skilled in the pertinent art to make and use the invention. The drawings, however, do not limit the scope or practice of the invention.

DETAILED DESCRIPTION OF THE PREFERRED EMBODIMENTS

The present invention relates to a printed circuit board (PCB) having an interstitial component and a method of making the same.

Figure 1:
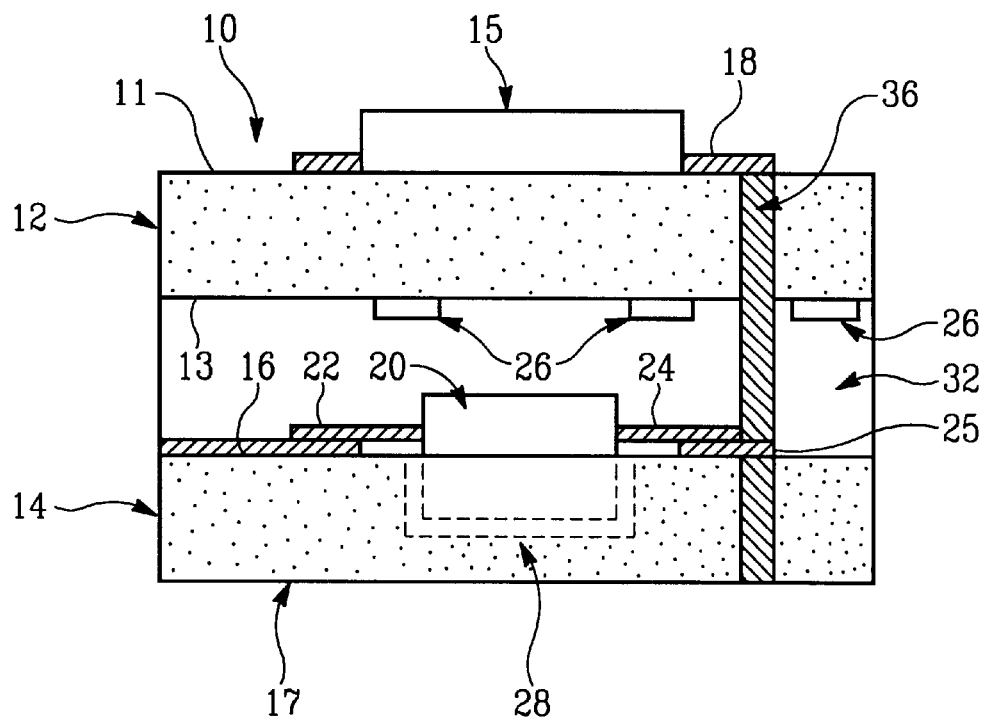
FIG. 1 shows an interstitial component in a printed circuit board ("PCB") according to an embodiment of the present invention.

FIG. 1 shows a first embodiment of the present invention, a PCB 10 having an interstitial component 20. PCB 10 includes a first layer 12 and a second layer 14. Layers 12 and 14 can be constructed from conventional PCB substrates, such as fiber glass-based materials (e.g., FR-4), Polyimide, Cyanate Ester, GTEK™, and Kevlar materials and the like. For example, layers 12 and 14 can be made out of FR-4, which is a conventional fiber glass-based substrate. The thickness of layers 12 and 14 are only limited by practical considerations, and can range from about 0.005 inches to at least 0.100 inches or greater.

Layer 12 has a first surface 11 and a second surface 13. Surface 11 acts as the top surface of PCB 10, and includes multiple trace patterns and can also include multiple components, such as ICs, ASICs, transistors, and the like, mounted thereon. For example, FIG. 1 shows an ASIC 15 mounted on surface 11 in a conventional manner. ASIC 15 includes one or more leads, such as lead 18, which is coupled to via 36 by a trace on surface 11. Via 36 is a conduit that allows passage of current and/or electrical signals to and from different layers of the PCB (including interior layers). Surface 13 can also include single or multiple traces 26. By "trace," it is meant a conventional metal conductor (e.g., copper) on an interior or exterior surface of a PCB that conducts electrical signals to various parts of the board.

Second layer 14 has surfaces 16 and 17. Surface 16 can include single or multiple traces, such as trace 25, and is opposed to surface 13 of first layer 12. In this embodiment, surfaces 13 and 16 define the interior portion of PCB 10 and surface 17 acts as the bottom surface of PCB 10. Also, in this embodiment, surface 16 includes a cut-out or recessed portion 28 that is configured to securely hold interstitial component 20. Recessed portion 28 can vary in size, depending on the size of component 20. The recessed portion can have a depth of a few thousandths of an inch ("mils") to tens of mils, depending on the thickness of the substrate layer, the size of the interstitial component, and the thickness of the interstitial layer 32.

Component 20 is an interstitial component residing in the interior portion of PCB 10. Interstitial component 20 can include any of a variety of coupling and termination components, such as diodes, transistors, resistors, capacitors, thermocouples, and the like. For example, interstitial component 20 can be a resistor having a similar size to a 0402 resistor (manufactured by Rohm Co.), which has a thickness of about 0.014 inches. Interstitial component 20 can have one or more leads, such as leads 22 and 24, to conduct signals to and from the interstitial component. In this embodiment, lead 24 is coupled to trace 25, which in turn is coupled to via 36. Via 36 can be coupled to a conventional processor or controller chip or circuit (not shown) that processes signals emitted from interstitial component 20 or sends signals, such as control signals, to the interstitial component.

PCB 10 further includes a laminate or interstitial layer 32 that includes a resin or pre-preg compound, such as a dielectric glue, that is applied throughout the interior region of PCB 10 to hold the PCB together. The pre-preg solution adheres to surfaces 13 and 16 and bonds the PCB layers together after appropriate pressure and thermal treatments. Preferably, the permittivity of the pre-preg compound matches the characteristics of the substrates used in forming the layers of the PCB. The thickness of interstitial layer 32 will depend on a variety of practical factors, including the thickness of the interstitial component and the overall PCB thickness desired.

For example, referring to FIG. 1, if a resistor similar in size to a 0402 resistor is used as an interstitial component, layer 14 can have a thickness of about 0.014 inches, the recessed portion can have a depth of about 0.007 inches, and the thickness of interstitial layer 32 can be about 0.007 inches to at least 0.012 inches or greater. Thus, interstitial component 20 will be completely enclosed in the interior portion of PCB 10.

A method of making PCB 10 is hereby described. Layers 12 and 14 are etched to expose trace metal patterns in a conventional chemical etch or photoresist etch process. During or after etching, according to an embodiment of the present invention, a portion or portions of a substrate layer surface, such as surface 16 of layer 14, is routed to form one or more recessed portions, such as recessed portion 28. The recessed portion can be formed by a mechanical routing process or by ablation techniques. Although recessed portion 28 is shown in FIG. 1 as being routed from surface 16 of layer 14, the recessed portion can also be routed from surface 13 of layer 12. Alternatively, the recessed portion can be formed by partially routing portions of surfaces 13 and 16, as would be apparent to one of skill in the art given the present description.

The interstitial component is then placed in the recessed portion, which is preferably configured to securely hold the interstitial component. In addition, a solder paste compound or the like can be applied to the interstitial component, which preferably has surface-mount axial leads, to couple contact leads from the interstitial component to the inner traces of the surface of the PCB layer. Soldering can be completed by conventional soldering techniques.

A conventional laminating step is employed to laminate the layers of the PCB together. A conventional PCB resin or pre-preg compound, such as a dielectric glue, is applied throughout the interior region of the PCB and is utilized to hold the laminations together. After application of the pre-preg compound, conventional pressure and heating treatments are employed to complete the formation of the PCB. While this type of construction includes intermediate steps to route the recessed portions in the interior portion (also referred to as the lamination layer), which may add cost to the PCB, the method according to this embodiment of the present invention permits the possibility of tuning the cavity to the frequencies of interest by, for example, offsetting an interstitial component's characteristic inductance. This tuning would allow for an even more stable impedance characteristic in the signal as it would reduce the perturbation seen by the signal.

According to the present invention, PCB surface area can be preserved by placing many components in interstitial locations. For example, conventional PCBs can include over 1000 different components placed on the top and bottom surfaces of the PCB. Furthermore, with conventional boards having acceptable thicknesses of about ¼ inches, many interstitial layers having multiple interstitial components can be employed in a straightforward manner.

A PCB according to the present invention allows for optimal placement of certain components in relation to others. For example, a component such as a large application specific integrated circuit (ASIC) may need to have its temperature monitored accurately. As mentioned above, current methods of monitoring this temperature place the thermocouple (or other monitoring device) some distance from the ASIC. While a correlation can be drawn between the ASIC temperature and the response of the thermocouple, due to the distances, air movement, and other factors, it will not be as accurate.

This problem is obviated by the present invention. According to another embodiment of the present invention, a thermocouple is used as interstitial component 20 shown in FIG. 1 and placed in close proximity to (here, directly under) the above-mounted device 15 (here, the ASIC chip). For example, if the recessed portion 28 is formed in layer 12, the interstitial component 20 can be spaced on the order of 0.005 inches from device 15, depending on the thickness of substrate layer 12 and the maximum allowable depth that still preserves the mechanical integrity of substrate layer 12. Because of the proximity of the thermocouple to the ASIC in this arrangement, more stable thermal characteristics can be utilized to determine the ASIC temperature. Alternatively, an interstitial component 20 can also be used to monitor other interstitial components (not shown).

Figure 2:
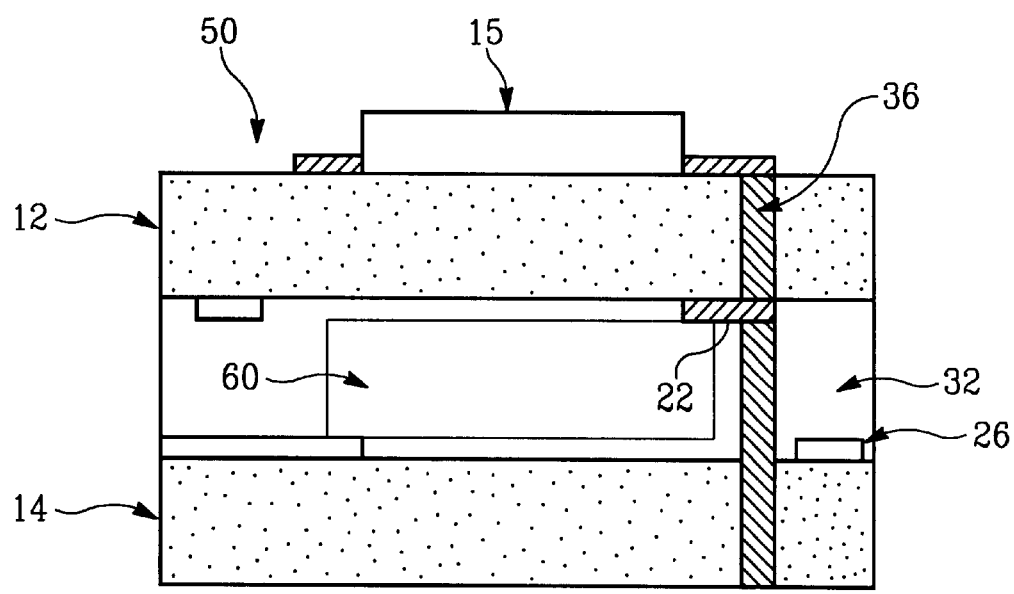
FIG. 2 shows an interstitial component in a PCB according to another embodiment of the present invention.

Alternatively, another PCB configuration can be utilized where there is no recessed portion used to hold the interstitial component. For example, as shown in FIG. 2, a PCB 50 comprises an ASIC 15 (or the like), a first layer 12, a second layer 14, and a sensing component 60 placed interstitially between layers 12 and 14. In a preferred embodiment, the sensing component 60 is a thermocouple. In this configuration, the routing step described above can be eliminated as the interstitial component can be held in place by the pre-preg material 32. Solder paste can be used in connecting the axial leads of the component, such as lead 22, to traces within the interstitial layer, which can be, in turn, coupled directly to a via, such as via 36.

Alternatively, according to another embodiment of the present invention, a sensing component such as a Hall effect element can be utilized to monitor the magnetic field of the PCB or of a specific component. In particular, an interstitial Hall effect element can be utilized to indicate whether or not a latch is closed completely while saving mechanical space. For example, some PCBs in some computer systems have the hinge points of their latches mounted directly to the PCB. The latch then makes contact with the computer chassis to hold the board in place. For example, when using a PCB as part of a data storage unit in a data storage application, if the latch is open, the storage unit acts one way and if the latch is closed, the storage unit acts another way in order to guarantee that data is safe. Sensors mounted on special brackets or with special latches adds cost and complexity while using up valuable mechanical space within the chassis. According to the present invention, for example, the substrate layers of the PCB can be designed such that a Hall effect element (or similar sensor) may or may not protrude from the PCB. If the Hall effect element is housed completely within an interstitial layer, then the trace metal may be removed from the substrate layer directly above the Hall effect element so the magnetic field from the magnets in the latch will interact with the Hall effect element.

Another application of the PCB of the present invention is to interstitially place coupling and termination components in the PCB for high-speed data signal traces. For example, high-speed signal traces require coupling capacitors to block DC signals in order to remove any DC offsets that could corrupt the incoming data. These traces also require termination resistors to be placed at the end of the line (and sometimes at the beginning as well) in order to match the termination impedance to the trace impedance. This proper termination reduces (or in the ideal case eliminates) voltage and current reflections on the traces that could corrupt the incoming and outgoing data. Furthermore, the device of the present invention can provide a better placement for these high speed coupling and termination components to achieve an improved signal quality.

Figure 3:
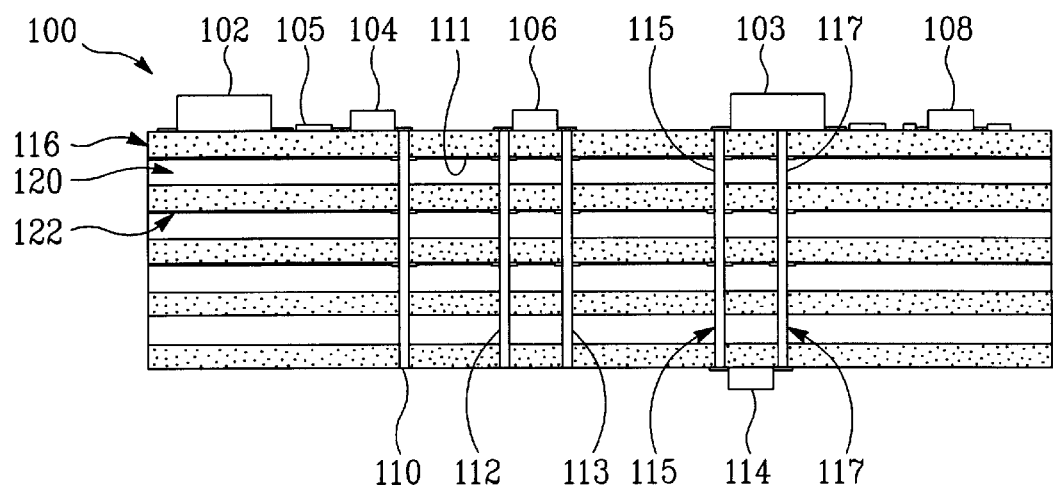
FIG. 3 shows a conventional fiber channel circuit.
Figure 4:
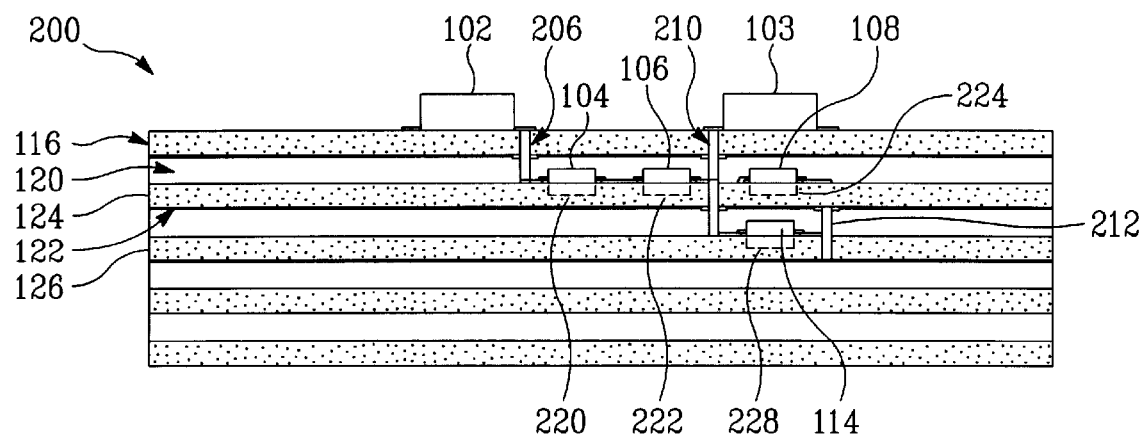
FIG. 4 shows a multi-layer PCB having multiple interstitial components according to an embodiment of the present invention.

As an illustration of a high speed circuit embodiment of the present invention, FIGS. 3 and 4 show a comparison between a conventional high speed digital circuit (FIG. 3) and a multi-layer PCB 100 having multiple interstitial components (FIG. 4). FIG. 3 shows the typical strip-line implementation of a high-speed digital circuit 100, such as a "Fibre Channel" circuit. Fibre Channel driver/receivers are shown as reference numbers 102, 103. Layer 116 is a conventional PCB substrate, such as a fiber-glass material. Interstitial layer 120 comprises a conventional PCB pre-preg compound, such as that described above. Layer 122 is a conventional interior copper plane, such as a ground plane.

Referring to FIG. 3, a conventional signal path is hereby described. A signal emanates from the left-most Fibre Channel chip 102. The signal travels on a short piece of microstrip 105 to a source terminating resistor 104, then down through a via 110 to an internal layer and thus onto a strip-line trace 111. In this figure, the vias go completely through the PCB 100. The signal then comes up through another via 112 into a coupling capacitor 106 and back down through another via 113 to the strip-line 111. The signal then travels to via 115, where it is sensed by the receiver 103, then travels to and through the terminating resistor 114, where it finally travels through the via 117 and into the ground plane 122. In this conventional situation, the original signal must travel through multiple vias that are the entire thickness of the board. This wastes space on both sides of the board, but more importantly, the long vias can cause signal degradation. The component placement can be optimized somewhat from this example depending on the application, but in general, FIG. 3 is representative of the space utilization and signal degradation problems using current technology.

Moreover, this arrangement restricts the placement of a thermocouple 108 that is to monitor chip 103. Since all of the aforementioned components are on the outside of the board, air currents may direct the heat away from the thermocouple and therefore produce inaccurate readings. In addition, it is possible that the air currents may sometimes direct the heat straight toward the thermocouple, leading to inaccurate and unreliable variable results.

According to an embodiment of the present invention, these problems can be overcome by a multi-layer PCB 200, shown in FIG. 4. In this example, five PCB substrate layers and four interstitial layers are utilized. As would be apparent to one of skill in the art given the present description, fewer or greater numbers of these layers can be utilized.

Many of the same components from FIG. 3 are present in FIG. 4, including source terminating resistor 104, coupling capacitor 106, terminating resistor 114, and thermocouple 108. PCB 200 further includes shortened vias 206, 210, and 212. As shown in this embodiment of the present invention, components 104, 106, 108, and 114 are interstitial components. These interstitial components can be placed in interstitial PCB layers, such as layer 120, in accordance with the methods described above. For example, cut-out or recessed regions, such as recess portions 220, 222, 224, and 228 can be formed in a surface of layers 124 and 126 for securedly placing the interstitial components. Alternatively, interstitial components can be placed in an interstitial layer, such as layer 120, and held in place by the pre-preg material. A solder paste can be used to connect the leads of the interstitial components to traces within the interstitial layer(s).

Further, this embodiment reduces the number and length of vias and the straight-through signal path. By placing components interstitially in the multi-layer PCB structure, additional space on the top surface of the PCB is created. Moreover, the top surface of the PCB is cleared for more space for mounting larger components that cannot fit interstitially in the PCB.

According to this embodiment, interstitial components are not limited to capacitors, resistors, and thermocouples, but rather any electronic component that fits within the confines of the interior of the PCB. In this way the PCB designer is not restricted merely to a two dimensional layout on the top and bottom of the board, but can create a three dimensional circuit assembly. For high speed device applications, this design allows optimal placement of critical components in relation to the signal traces in order to reduce signal perturbations and potential EMI radiation.

The multi-layer PCB embodiment shown in FIG. 4 also allows for a more precise positioning of a thermocouple, or other sensing component, with respect to the component that is being measured. For example, having a thermocouple 108 placed directly below the device to be measured 103 and surrounded by a controlled and known material (such as a PCB substrate 116 and pre-preg material 120), allows for measurements from the thermocouple to be correlated completely with the temperature of the measured device and will remain invariable over time. This will greatly improve the accuracy and, more importantly, eliminate the variability to ensure more reliable results.

While the invention has been described in detail and with reference to specific embodiments thereof, it will be apparent to one skilled in the art that various changes and modifications can be made therein without departing from the scope of the invention. Thus, the breadth and scope of the present invention should not be limited by any of the above-described exemplary embodiments.

What is claimed is:

1. A printed circuit board, comprising:
   first, second, and third printed circuit board (PCB) substrate layers;
   an above-board device mounted on an outer surface of the first PCB layer;
   first and second interstitial layers disposed between said first and second PCB substrate layers and said second and third PCB substrate layers, respectively, said first and second interstitial layers comprising a dielectric compound that laminates bordering substrate layers;
   a first interstitial component having a lead, securely disposed in the first interstitial layer and a second interstitial component securely disposed in the second interstitial layer; and
   a via electrically connecting at least two of said PCB substrate layers.

2. The printed circuit board according to claim 1, wherein said first PCB substrate layer has first and second surfaces, said first surface including a device mounted thereon, wherein said second PCB layer has third and fourth surfaces, wherein one of said second and third surfaces includes a recessed portion and wherein said second and third surfaces are opposed to one another, and wherein said interstitial component is securely disposed in said recessed portion, and is located in proximity to said mounted device.

3. The printed circuit board according to claim 2, wherein a distance from said mounted device to said interstitial component is less than 0.100 inches.

4. The printed circuit board according to claim 1, further comprising:
   a plurality of interstitial components disposed in either of said first and second interstitial layers, each of said plurality of interstitial components having a lead coupled to one of a plurality of vias electrically connecting at least two of said substrate layers.

5. The printed circuit board according to claim 1, wherein said first interstitial component is a thermocouple disposed in said first interstitial layer and in proximity to the above-board device.

6. The printed circuit board according to claim 1, wherein the above-board device is coupled to a trace, wherein said trace is coupled to said via, and wherein one of said interstitial components is a resistor.

* * * * *